US008983094B2

(12) United States Patent
He

(10) Patent No.: US 8,983,094 B2
(45) Date of Patent: Mar. 17, 2015

(54) ALL-IN-ONE COMPUTER AUDIO SYSTEM

(75) Inventor: Feng-Long He, Shenzhen (CN)

(73) Assignee: Zhongshan Innocloud Intellectual Property Services Co., Ltd., Guangdong (CN)

(*) Notice: Subject to any disclaimer, the term of this patent is extended or adjusted under 35 U.S.C. 154(b) by 1154 days.

(21) Appl. No.: 12/949,831

(22) Filed: Nov. 19, 2010

(65) Prior Publication Data

US 2012/0076326 A1 Mar. 29, 2012

(51) Int. Cl.
*H03F 99/00* (2009.01)
*H04R 3/00* (2006.01)
*H04R 1/10* (2006.01)

(52) U.S. Cl.
CPC ................ *H04R 3/00* (2013.01); *H04R 1/1041* (2013.01); *G09G 2370/04* (2013.01); *G09G 2370/12* (2013.01)
USPC ........... 381/120; 381/333; 381/388; 381/123; 381/306; 361/679.02; 700/94; 386/335; 348/E7.002; 348/E7.004

(58) Field of Classification Search
USPC ........... 381/120, 333, 332, 87, 388, 386, 123, 381/150, 306; 361/679.21, 679.02, 679.26; 386/335, 339, 338, 337; 348/E7.004, 348/E7.016, E7.002
See application file for complete search history.

(56) References Cited

U.S. PATENT DOCUMENTS

| | | | | |
|---|---|---|---|---|
| 7,953,910 | B2 * | 5/2011 | Kakish | 710/65 |
| 2008/0036918 | A1 * | 2/2008 | Huang | 348/738 |
| 2008/0303946 | A1 * | 12/2008 | Cox et al. | 348/552 |
| 2010/0245667 | A1 * | 9/2010 | Hardacker et al. | 348/552 |
| 2012/0243709 | A1 * | 9/2012 | Chung | 381/99 |

* cited by examiner

*Primary Examiner* — Vivian Chin
*Assistant Examiner* — Con P Tran
(74) *Attorney, Agent, or Firm* — Novak Druce Connolly Bove + Quigg LLP

(57) ABSTRACT

An all-in-one audio system includes an audio chip, an audio interface, first and second audio signal amplifiers, a speaker, a woofer, a multi-function controller, a high definition multimedia interface (HDMI), and a switch. The multi-function controller is connected to the audio chip, the switch, the audio interface, the first and second audio signal amplifiers, and the HDMI. When the multi-function controller detects a high definition multimedia signal through the HDMI, the multi-function controller turns off the switch, decodes the high definition multimedia signal into an audio signal, and transmits the audio signal to the audio interface, and the first and second audio signal amplifiers. The first and second audio signal amplifiers amplify the audio signal and output the amplified audio signal to the speaker and woofer.

2 Claims, 1 Drawing Sheet

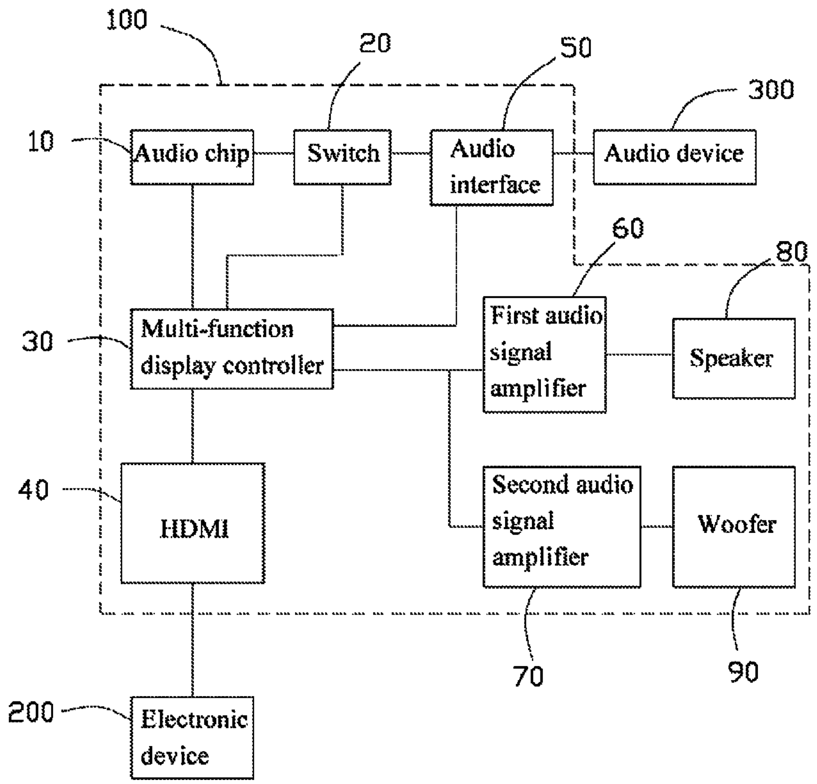
100
20
50
300
10
Audio chip
Switch
Audio interface
Audio device
60
80
30
Multi-function display controller
First audio signal amplifier
Speaker
40
HDMI
Second audio signal amplifier
Woofer
70
90
200
Electronic device

ALL-IN-ONE COMPUTER AUDIO SYSTEM

BACKGROUND

1. Technical Field

The present disclosure relates to an all-in-one computer audio system.

2. Description of Related Art

With the development of all-in-one computers, uses of the all-in-one computer is increasing. One use of the all-in-one computer is as an independent display for other equipment. When a conventional all-in-one computer is only used as a display, there is no independent audio circuit in the conventional all-in-one computer to response to the equipment, thus, the conventional all-in-one computer can not function as a display with audio function.

BRIEF DESCRIPTION OF THE DRAWING

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

The FIGURE is a block diagram of an exemplary embodiment of an all-in-one computer audio system connected to an electronic device and an audio device.

DETAILED DESCRIPTION

The disclosure, including the accompanying drawing, is illustrated by way of example and not by way of limitation. It should be noted that references to "an" or "one" embodiment in this disclosure are not necessarily to the same embodiment, and such references mean at least one.

Referring to the FIGURE, an exemplary embodiment of an all-in-one computer audio system 100 includes an audio chip 10, a switch 20, a multi-function controller 30, a high definition multimedia interface (HDMI) 40, an audio interface 50, a first audio signal amplifier 60, a second audio signal amplifier 70, a speaker 80, and a woofer 90. The multi-function controller 30 is connected to the audio chip 10, the switch 20, the HDMI 40, and the audio interface 50. The multi-function controller 30 is also respectively connected to the speaker 80 and the woofer 90 by the first and second audio signal amplifiers 60 and 70. The audio interface 50 is connected to the switch 20.

The HDMI 40 is connected to an electronic device 200, such as a host computer. When the electronic device 200 is turned on, the electronic device 200 outputs a high definition multimedia signal to the multi-function controller 30 through the HDMI 40.

The audio interface 50 is connected to an audio device 300, such as an earphone.

When only the audio chip 10 outputs a first audio signal to the multi-function controller 30, the multi-function controller 30 only detects the first audio signal, and turns on the switch 20 to make the audio chip 10 transmit the audio signal to the audio device 300 through the audio interface 50 directly. At the same time, the multi-function controller 30 outputs the first audio signal to the first and second audio signal amplifiers 60 and 70. The first and second audio signal amplifiers 60 and 70 amplify the first audio signal and output the amplified first audio signal to the speaker 80 and the woofer 90 respectively.

When the electronic device 200 connected to the HDMI 40 is turned on, the electronic device 200 outputs the high definition multimedia signal to the multi-function controller 30 through the HDMI 40. When the multi-function controller 30 detects the high definition multimedia signal, whether the multi-function controller 30 detects the first audio signal from the audio chip 10 or not, the multi-function controller 30 turns off the switch 20. The multi-function controller 30 decodes the high definition multimedia signal into a second audio signal and a video signal. The multi-function controller 30 outputs the video signal to a video circuit (not shown) of an all-in-one computer to display a video. The multi-function controller 30 outputs the second audio signal to the audio device 300 through the audio interface 50. At the same time, the multi-function controller 30 outputs the second audio signal to the first and second audio signal amplifiers 60 and 70. The first and second audio signal amplifiers 60 and 70 amplify the second audio signal, and output the amplified second audio signal to the speaker 80 and the woofer 90.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. An all-in-one computer audio system comprising:
- an audio chip to output a first audio signal;
- an audio interface to connect to an audio device;
- a high definition multimedia interface (HDMI) to connect to an electronic device, wherein when the electronic device is turned on, the electronic device outputs a high definition multimedia signal to the HDMI;
- a switch connected between the audio chip and the audio interface;
- a multi-function controller connected to the switch to control the audio chip to transmit the first audio signal to the audio interface, connected to the audio chip to receive the first audio signal, connected to the HDMI to receive the high definition multimedia signal to decode the high definition multimedia signal into a second audio signal, and connected to the audio interface to transmit the second audio signal to the audio device by the audio interface;
- a speaker;
- a woofer;
- a first audio signal amplifier connected between the multi-function controller and the speaker to amplify the first and second audio signals, and output the amplified first and second audio signals; and
- a second audio signal amplifier connected between the multi-function controller and the woofer to amplify the first and second audio signals, and output the amplified first and second audio signals;
- wherein when the multi-function controller receives the high definition multimedia signal through the HDMI, the multi-function controller turns off the switch to disconnect the audio chip from the audio interface, and transmit the second audio signal to the first and second audio signal amplifiers.

2. The all-in-one computer audio system of claim 1, wherein when the multi-function controller only detects the first audio signal from the audio chip, the multi-function controller turns on the switch to allow the audio chip to transmit the first audio signal to the audio interface, and outputs the first audio signal to the first and second audio signal amplifiers.

* * * * *